United States Patent [19]
Fujita

[11] Patent Number: 5,293,340
[45] Date of Patent: Mar. 8, 1994

[54] DYNAMIC RANDOM ACCESS MEMORY DEVICE WITH MULTIPLE WORD LINE SELECTOR USED IN BURN-IN TEST

[75] Inventor: Mitsuoki Fujita, Tokyo, Japan

[73] Assignee: NEC Corporation, Tokyo, Japan

[21] Appl. No.: 867,361

[22] Filed: Apr. 13, 1992

[30] Foreign Application Priority Data
  Apr. 19, 1991 [JP] Japan .................. 3-115563

[51] Int. Cl.⁵ .............................. G11C 29/00
[52] U.S. Cl. .................. 365/201; 365/200; 365/230.06
[58] Field of Search ............. 365/201, 200, 230.06; 371/21.1, 21.2

[56] References Cited
U.S. PATENT DOCUMENTS

| | | | |
|---|---|---|---|
| 4,720,818 | 1/1988 | Takeguchi | 365/201 |
| 4,751,679 | 6/1988 | Dehganpour | 365/201 |
| 4,802,137 | 1/1989 | Okuda et al. | 365/201 |
| 4,905,194 | 2/1990 | Ohtsuka et al. | 365/201 |
| 4,999,813 | 3/1991 | Ohtsuka et al. | 365/201 |

*Primary Examiner*—Eugene R. LaRoche
*Assistant Examiner*—Tan Nguyen
*Attorney, Agent, or Firm*—Sughrue, Mion, Zinn, Macpeak & Seas

[57] ABSTRACT

A dynamic random access memory device is subjected to a burn-in test operation prior to delivery from a factory, and is equipped with an auxiliary word line driving unit so that all of the word lines are simultaneously driven by the auxiliary word line driving unit in the burn-in test operation, thereby shrinking time period for the burn-in test operation.

4 Claims, 3 Drawing Sheets

DYNAMIC RANDOM ACCESS MEMORY DEVICE WITH MULTIPLE WORD LINE SELECTOR USED IN BURN-IN TEST

FIELD OF THE INVENTION

This invention relates to a dynamic random access memory device and, more particularly, to a multiple word line selector incorporated in the dynamic random access memory device for a burn-in test on the memory cells.

DESCRIPTION OF THE RELATED ART

Upon completion of fabrication process for a dynamic random access memory device, the dynamic random access memory device is subjected to various test operations, and one of the test operations is known as "burn-in test". In the burn-in test, the dynamic random access memory device is placed in high temperature ambience, and the word lines are driven to active level after writing data bits in the memory cells. However, the prior art dynamic random access memory can simultaneously drive a single or a few word lines selected from all the word lines, and the burn-in test tends to be prolonged due to the sequential drive for the word lines. If 1024 word lines of the prior art dynamic random access memory device are sequentially driven to the active level from a word line to another word line, the prior art dynamic random access memory device needs to repeat the word line drive 1024 times, and long time period is consumed for the burn-in test. The dynamic random access memory device is continuously increasing the memory capacity, and, accordingly, the word lines incorporated therein are increased together with the memory cells. This means that the time period tends to be prolonged, and the cost for the diagnosis is increased together with the memory capacity.

SUMMARY OF THE INVENTION

It is therefore an important object of the present invention to provide a dynamic random access memory device which can shrink time period for the diagnostic operation.

To accomplish the object, the present invention proposes to simultaneously drive all of the word lines with one of the signal pins.

In accordance with the present invention, there is provided a dynamic random access memory device fabricated on a single semiconductor chip and having a standard mode and a diagnostic mode of operation, comprising: a) a plurality of memory cells arranged in rows and columns; b) a plurality of bit line pairs respectively coupled with the columns of the plurality of memory cells for propagating data bits; c) a plurality of word lines respectively coupled with the rows of the plurality of memory cells, and selectively driven to an active level for allowing the data bits to be transferred between the plurality of bit line pairs and one of the word lines in the standard mode of operation; and d) an auxiliary word line driving unit coupled between the plurality of word lines and a first predetermined pin applied with a first external clock signal, and operative to supply the first external clock signal to all of the plurality of word lines in the diagnostic mode of operation.

BRIEF DESCRIPTION OF THE DRAWINGS

The features and advantages of the dynamic random access memory device according to the present invention will be more clearly understood from the following description taken in conjunction with the accompanying drawings in which.

DESCRIPTION OF THE PREFERRED EMBODIMENTS

First Embodiment

Figure 1:
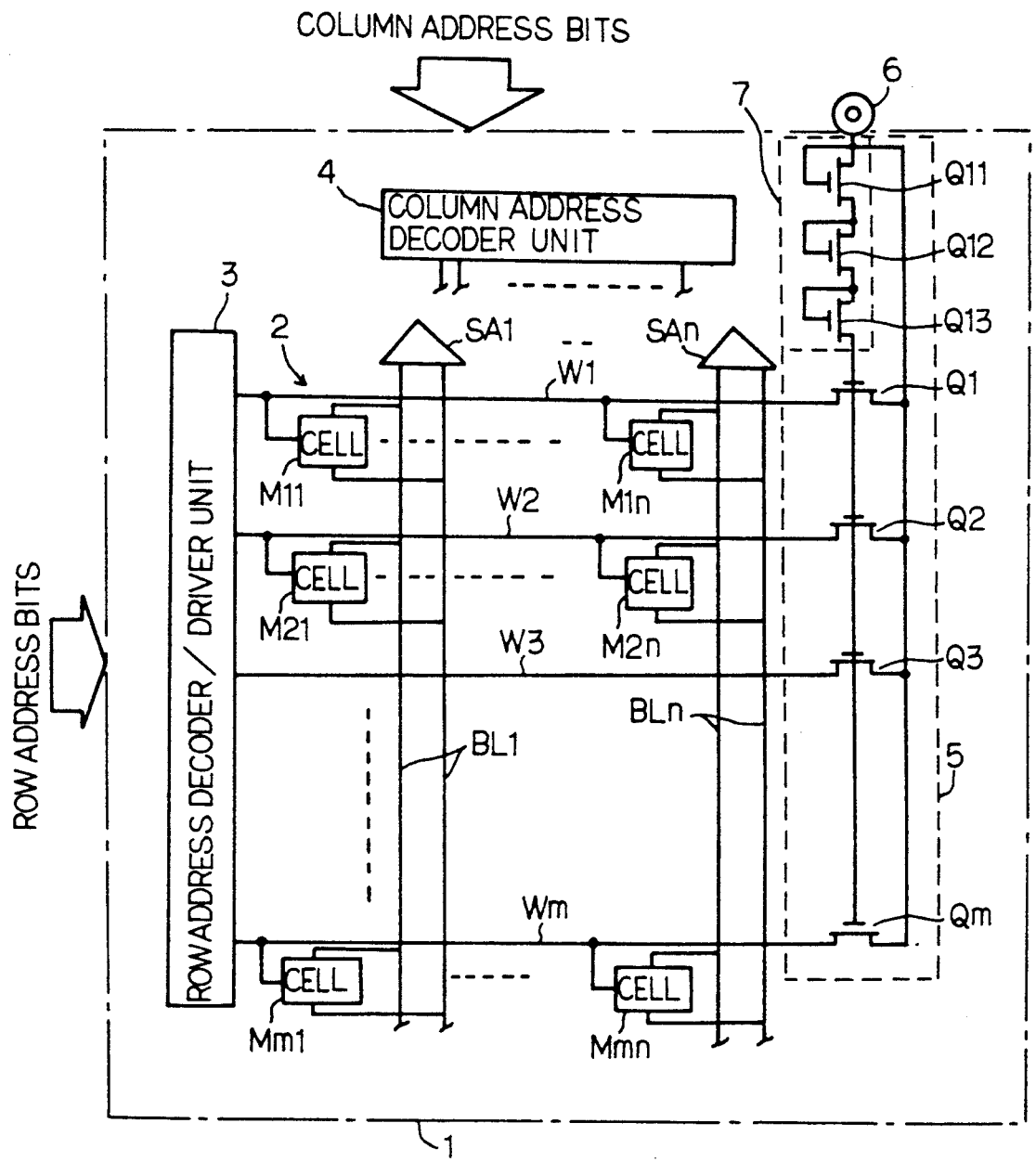
FIG. 1 is a circuit diagram showing the circuit arrangement of a dynamic random access memory device according to the present invention.

Referring first to FIG. 1 of the drawings, a dynamic random access memory device embodying the present invention is fabricated on a single semiconductor chip 1, and comprises a memory cell array 2 implemented by a plurality of memory cells M11, M1n, M21, M2n, Mm1 and Mmn arranged in rows and columns. Though not shown in the drawings, each of the memory cells M11 to Mmn is implemented by a series combination of an n-channel enhancement type switching transistor and a storage capacitor. Word lines W1, W2, W3 and Wm are respectively coupled with the memory cells M11 to Mmn in the rows of the memory cell array 2, and bit line pairs BL1 to BLn are respectively coupled with the memory cells in the columns of the memory cell array 2 for propagating data bits to associated sense amplifier circuits SA1 to SAn. A row address decoder and driver unit 3 is associated with the word lines W1 to Wm, and drives one of the word lines W1 to Wm indicated by row address bits. Though not shown in FIG. 1, a column selector is coupled between the sense amplifier circuits SA1 to SAn and a data pin, and a column address decoder unit 4 allows one of the bit line pairs BL1 to BLn indicated by column address bits to couple through the column selector with the data pin.

The dynamic random access memory device shown in FIG. 1 further comprises an auxiliary word line driver unit 5 coupled with the word lines W1 to Wm, and the auxiliary word line driver unit 5 is provided on the opposite side to the row address decoder and driver unit 3. The auxiliary word line driver 5 is implemented by a plurality of p-channel enhancement type switching transistors Q1, Q2, Q3 and Qm, and the drain nodes of the p-channel enhancement type switching transistors Q1 to Qm are respectively coupled with the word lines W1 to Wm. The source nodes of the p-channel enhancement type switching transistors Q1 to Qm are commonly coupled with a predetermined pin 6, and the predetermined pin 6 is coupled through a step-down circuit 7 with the gate electrodes of the p-channel enhancement type switching transistors Q1 to Qm. The step-down circuit 7 is implemented by a series combination of p-channel enhancement type load transistors Q11, Q12 and Q13, and decreases a voltage level at the predetermined pin 6.

When the dynamic random access memory device is installed in an electronic system, data bits are written into or read out from the memory cells M11 to Mmn indicated by the row and column address bits, and the row address decoder and driver unit 3 lifts one of the word lines W1 to Wm to an active level. Memory cells coupled with the activated word line are coupled with the bit line pairs BL1 to BLn, and data bits are transferred therebetween.

However, the dynamic random access memory device is subjected to various test operations prior to delivery from the manufacturing factory. The burn-in test operation is carried out for the dynamic random access memory device for screening a defective product with breakable memory cells, and the burn-in test traces the following sequence. First, data bit of logic "0" is written into all of the memory cells M11 to Mmn, and a plurality of clock pulses are supplied to the predetermined pin 6. Each clock pulse is distributed from the predetermined pin 6 to the source nodes of the p-channel enhancement type switching transistors Q1 to Qm, and the step-down circuit 7 supplies the gate electrodes a voltage level lower than the source nodes by the threshold level of the switching transistors Q1 to Qm. Then, the p-channel enhancement type switching transistors Q1 to Qm simultaneously turn on in the presence of every clock pulse, and the clock pulses are transferred to all of the word lines W1 to Wm. With the clock pulses, the gate oxide films of the n-channel enhancement type switching transistors are stressed. Next, data bit of logic "1" level is written into all of the memory cells M11 to Mmn, and a plurality of clock pulses are applied to a pin. The data write-in and the application of stress are repeated predetermined times, and the manufacturer diagnoses the memory cells M11 to Mmn.

Thus, the clock pulses are simultaneously applied to the all of the word lines W1 to Wm in the burn-in test operation, and the burn-in test operation is completed within short time period rather than the prior art dynamic random access memory device.

Second Embodiment

Figure 2:
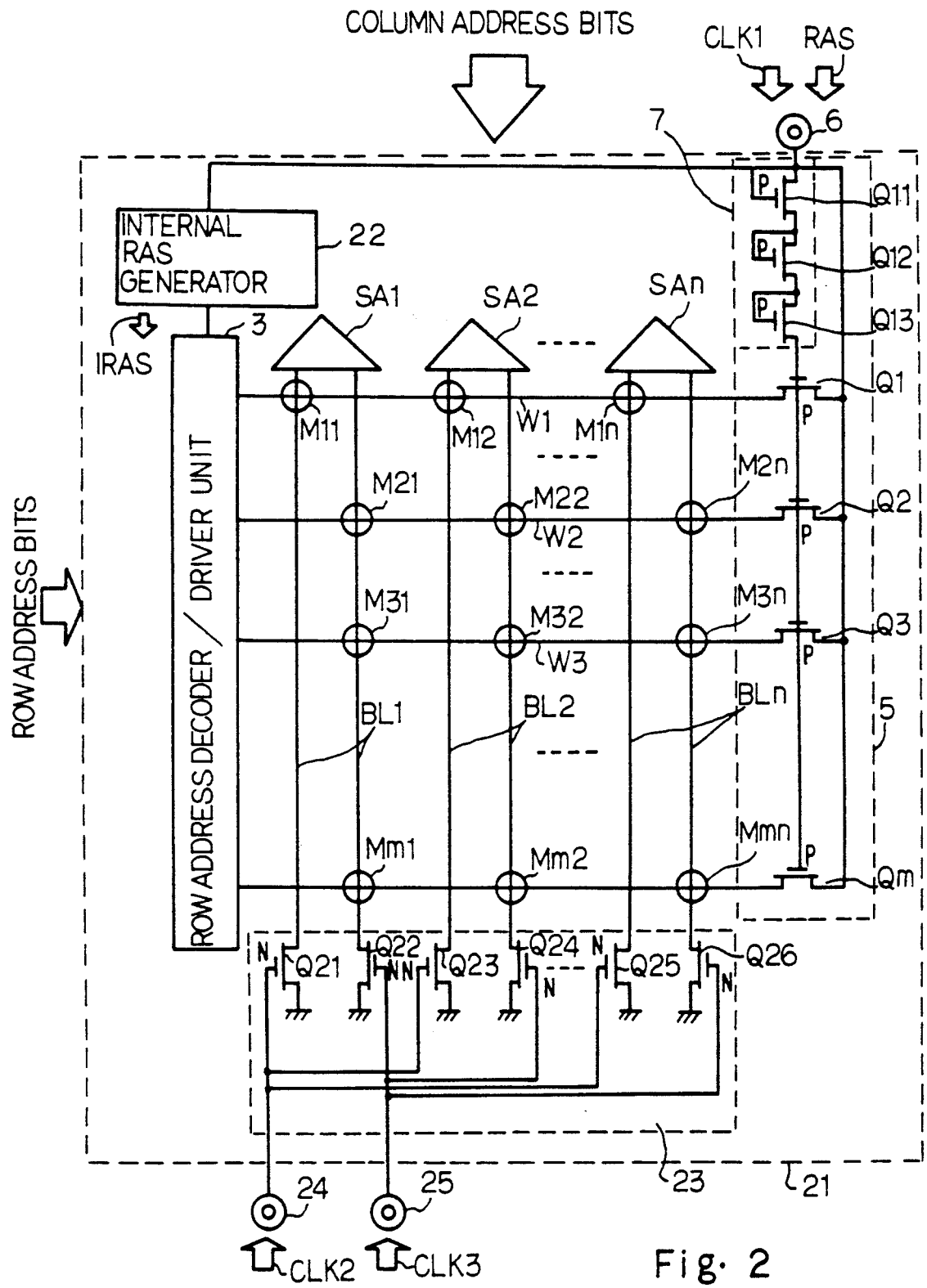
FIG. 2 is a circuit diagram showing the circuit arrangement of another dynamic random access memory device according to the present invention.
Figure 3:
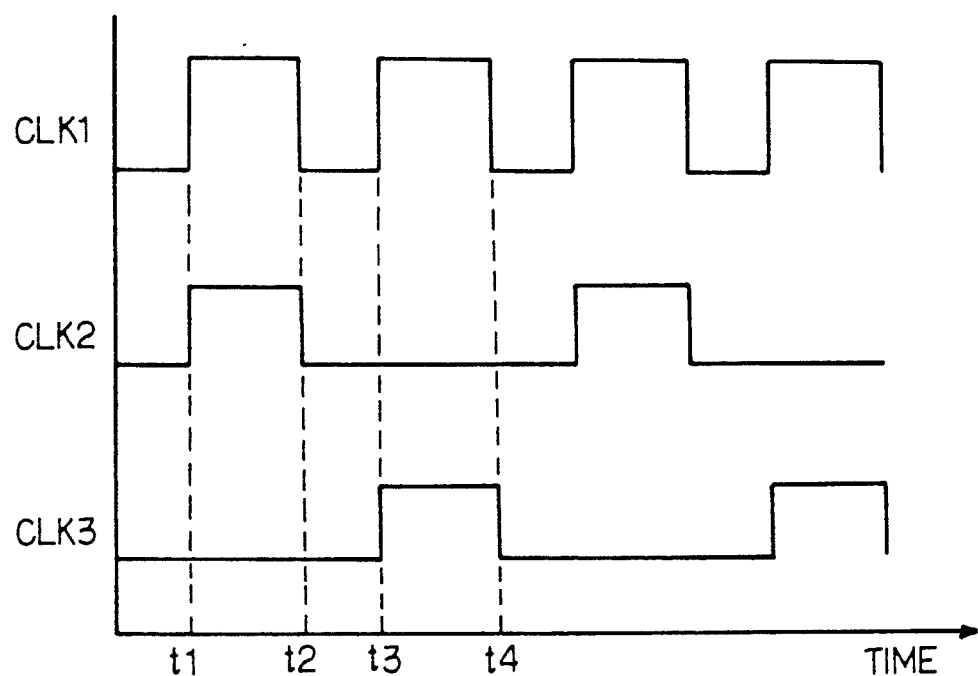
FIG. 3 is a diagram showing the waveforms of clock signals applied to the dynamic random access memory device shown in FIG. 2.

Turning to FIG. 2 of the drawings, another dynamic random access memory device embodying the present invention is fabricated on a single semiconductor chip 21. The dynamic random access memory device shown in FIG. 2 is similar in circuit arrangement to the first embodiment except for some additional circuits, and components are labeled with the same references as the corresponding components of the dynamic random access memory device shown in FIG. 1 without description.

In this instance, an external row address strobe signal RAS is applied to the first predetermined pin 6 in the standard mode of operation having a write-in phase and a read-out phase, and a first clock signal CLK1 is supplied to the first predetermined pin 6 in the diagnostic mode of operation. For this reason, the first predetermined pin 6 is coupled in parallel with the auxiliary wordline driving unit 5 and an internal row address strobe generator 22.

The dynamic random access memory device implementing the second embodiment further comprises a switching circuit 23 which is implemented by a plurality of pairs of n-channel enhancement type switching transistors Q21, Q22, Q23, Q24, Q25 and Q26. The pairs of n-channel enhancement type switching transistors Q21 to Q26 are respectively coupled with the bit line pairs BL1, BL2 and BLn and a ground voltage line serving as a source of logic "0" level. The gate electrodes of the n-channel enhancement type switching transistors Q21, Q23 and Q25 are coupled with a second predetermined pin 24, and the other n-channel enhancement type switching transistors Q22, Q24 and Q26 are coupled at the gate electrodes thereof with a third predetermined pin 25. Second and third clock signals CLK2 and CLK3 are respectively supplied to the second and third predetermined pins 24 and 25 in synchronism with the first clock signal CLK1 as shown in FIG., 3.

The circuit behavior in the standard mode of operation is similar to that of the first embodiment, and no further description is incorporated hereinbelow for avoiding repetition. Assuming now that the dynamic random access memory device shown in FIG. 2 enters the burn-in test operation in the diagnostic mode. The burn-in test starts without write-in of a data bit into all of the memory cells M11, M12, M1n, M21, M22, M2n, M31, M32, M3n, Mm1, Mm2 and Mmn, and the first clock signal CLK1 is supplied to the first predetermined pin 6. The first clock signal CLK1 allows the auxiliary word line driving unit 5 to lift all of the word lines W1 to Wm to the active level at time t1, and the second clock signal CLK2 rises together with the first clock signal CLK1 so that the n-channel enhancement type switching transistors Q21, Q23 and Q25 discharges the associated bit lines, thereby supplying logic "0" to these bit lines. The first and second clock signals CLK1 and CLK2 ar recovered to the low voltage level at time t2, and the first and third clock signals CLK1 and CLK3 are lifted to the high voltage level at time t3. The n-channel enhancement type switching transistors Q22, Q24 and Q26 turn on so as to discharge the associated bit lines, and the first and third clock signals CLK1 and CLK3 are recovered at time t4. Thus, the switching circuit 23 alternately supplies logic "1" level to half of the bit lines, and stress is applied to all of the memory cells M11 to Mmn without any write-in operation.

As will be understood from the foregoing description, the auxiliary word line driving unit of the dynamic random access memory device according to the present invention simultaneously drives all of the word lines W1 to Wm, and the burn-in test operation is completed within short time period. This results in reduction of production cost of the dynamic random access memory device.

Although particular embodiments of the present invention have been shown and described, it will be obvious to those skilled in the art that various changes and modifications may be made without departing from the spirit and scope of the present invention.

What is claimed is:

1. A dynamic random access memory device fabricated on a single semiconductor chip and having a standard mode and a diagnostic mode of operation, comprising:

a) a plurality of memory cells arranged in rows and columns;

b) a plurality of bit line pairs respectively coupled with the columns of said plurality of memory cells for propagating data bits;

c) a plurality of word lines respectively coupled with the rows of said plurality of memory cells, and selectively driven to an active level for allowing said data bits to be transferred between said plurality of bit line pairs and one of said rows of said plurality of memory cells in said standard mode of operation; and d) an auxiliary word line driving unit simultaneously providing conduction paths between said plurality of word lines and a first predetermined pin in response to a first external clock signal at said first predetermined pin in said diagnostic mode of operation, and operative to transfer a first external clock signal from said first predetermined pin to all of said plurality of word lines for allowing said plurality of memory cells to be concurrently conducted with said plurality of bit line pairs in said diagnostic mode of operation.

2. A dynamic random access memory device fabricated on a single semiconductor chip and having a standard mode and a diagnostic mode of operation, comprising:

a) a plurality of memory cells arranged in rows and columns;

b) a plurality of bit line pairs respectively coupled with the columns of said plurality of memory cells for propagating data bits;

c) a plurality of word lines respectively coupled with the rows of said plurality of memory cells, and selectively driven to an active level for allowing said data bits to be transferred between said plurality of line pairs and one of said rows of said plurality of memory cells in said standard mode of operation; and d) an auxiliary word line driving unit coupled between said plurality of word lines and a first predetermined pin applied with a first external clock signal, and operative to supply said first external clock signal to all of said plurality of word lines in said diagnostic mode of operation, said auxiliary word line driving unit comprising a plurality of switching transistors coupled between said plurality of word lines and said first predetermined pin, a voltage control circuit being provided in association with said auxiliary word line driving unit for producing a gate voltage from said first external clock signal, said gate voltage being supplied to gate electrodes of said plurality of switching transistors so as to allow said plurality of switching transistors to concurrently turn on.

3. A dynamic random access memory device fabricated on a single semiconductor chip and having a standard mode and a diagnostic mode of operation, comprising:

a) a plurality of memory cells arranged in rows and columns;

b) a plurality of bit line pairs respectively coupled with the columns of said plurality of memory cells for propagating data bits;

c) a plurality of word lines respectively coupled with the rows of said plurality of memory cells, and selectively driven to an active level for allowing said data bits to be transferred between said plurality of line pairs and one of said rows of said plurality of memory cells in said standard mode of operation;

d) an auxiliary word line driving unit coupled between said plurality of word lines and a first predetermined pin applied with a first external clock signal, and operative to supply said first external clock signal to all of said plurality of word lines in said diagnostic mode of operation; and e) a switching circuit coupled between said plurality of bit line pairs and a source of a first logic level, and responsive to second and third external clock signals alternately lifted to an active level in synchronism with said first external clock signal for alternately supplying said first logic level to component bit lines of said plurality of bit line pairs.

4. A dynamic random access memory device as set forth in claim 3, in which said switching circuit comprises e-1) a plurality of first switching transistors each coupled between said source of first logic level and one of the component bit lines of each bit line pair, and responsive to said one of said second and third external clock signals, and e-2) a plurality of second switching transistors each coupled between said source of first logic level and the other of the component bit lines of said each bit line pair, and responsive to the other of said second and third external clock clock signals. signals, and e-2) a plurality of second switching transistors each coupled between said source of first logic level and the other of the component bit lines of said each bit line pair, and responsive to the other of said second and third external clock clock signals.

* * * * *

UNITED STATES PATENT AND TRADEMARK OFFICE
CERTIFICATE OF CORRECTION

PATENT NO.　:　5,293,340
DATED　　　:　March 8, 1994
INVENTOR(S):　Mitsuoki FUJITA

It is certified that error appears in the above-identified patent and that said Letters Patent is hereby corrected as shown below:

```
Col. 4, line 27, delete "ar" and insert --are--.
Col. 6, line 12, before "line", insert --bit--;
Col. 6, line 38, delete the second occurrence of "clock";
Col. 6, line 38, delete "sig";
Col. 6, delete lines 39-43.
```

Signed and Sealed this

Sixteenth Day of August, 1994

Attest:

BRUCE LEHMAN

*Attesting Officer*　　　*Commissioner of Patents and Trademarks*